United States Patent [19]

Rattcliff et al.

[11] 3,772,632

[45] Nov. 13, 1973

[54] MANUFACTURE OF ELECTRIC COMPONENTS

[75] Inventors: Graham Rattcliff, Sevenoaks; Ronald Sidney Thomas Kemp, Coulsdon, both of England

[73] Assignee: Thomas Jermyn, Sevenoaks, Kent, England

[22] Filed: Apr. 6, 1972

[21] Appl. No.: 241,521

[30] Foreign Application Priority Data

| | | |
|---|---|---|
| Apr. 23, 1971 | Great Britain | 11,079/71 |
| Nov. 29, 1971 | Great Britain | 11,079/71 |

[52] U.S. Cl. ..... 339/17 CF, 317/101 CC, 339/61 M, 339/174, 339/278 C

[51] Int. Cl. .......... H05k 1/02

[58] Field of Search .......... 339/17 L, 17 R, 17 C, 339/17 E, 17 F, 17 B, 176 MP, 176 M, 61, 59, 66, 174, 275, 278; 317/101 CC

[56] References Cited

UNITED STATES PATENTS

| | | | |
|---|---|---|---|
| 3,388,366 | 6/1968 | Mitchell | 339/17 C |
| 3,685,002 | 8/1972 | Kennedy | 339/17 CF |
| 3,611,250 | 10/1971 | Reed | 339/17 CF |
| 3,391,382 | 7/1968 | Leibovitz | 339/17 CF X |
| 3,480,902 | 11/1969 | Barnes et al. | 339/17 CF |
| 3,638,166 | 1/1972 | Steipe | 339/61 M |
| 3,153,213 | 10/1964 | Stanwyck | 339/17 C X |
| 2,905,744 | 9/1959 | Rayburn et al. | 317/101 CC X |
| 3,441,853 | 4/1969 | Bodine | 339/17 CF X |
| 3,701,076 | 10/1972 | Irish | 317/101 CC X |
| 2,707,272 | 4/1955 | Blitz | 317/101 CC X |

FOREIGN PATENTS OR APPLICATIONS

| | | | |
|---|---|---|---|
| 1,208,375 | 1/1966 | Germany | 339/17 B |
| 1,078,291 | 8/1967 | Great Britain | 317/101 CC |

*Primary Examiner*—Marvin A. Champion
*Assistant Examiner*—Terrell P. Lewis
*Attorney*—Martin Fleit et al.

[57] ABSTRACT

A socket for electrical components having a body of electrically insulating material provided with a plurality of socket recesses and connecting pins.

The connecting pins are moulded integrally with the body with the body being coated with electrically conductive material which has subsequently been selectively removed to leave conductive material upon the connector pins and in the recesses to provide electrical connections, the coating of the connector pins being individually electrically connected by coating material to respective socket recesses.

14 Claims, 11 Drawing Figures

MANUFACTURE OF ELECTRIC COMPONENTS

This invention relates to the manufacture of electric sockets and is, in its preferred form, embodied in a mounting pad or socket for integrated circuits or other electronic components.

The present invention is principally directed at the provision of an electrical socket in which instead of providing electrical connections by mounting metal parts in a body of an insulating material, for example of synthetic plastics material, the necessary electrical connections are provided by plating, or otherwise coating selected portions of the body with an electric conducting material.

According to the invention there is provided a socket for mounting electrical components and comprising a body of electric insulating material having a plurality of socket recesses moulded therein and also having connecting pins moulded integrally with the body, said body being coated with electrically conductive material which has subsequently been selectively removed to leave conductive material upon the connector pins and in the recesses to provide electrical connections, the coating of the connector pins being individually electrically connected by coating material to respective socket recesses. Thus, at these locations where electrically conductive portions are required the recessed surface portions may comprise channels in the insulating material which upon removal of coating material from the portions of the insulating material surrounding these channels leaves a surface covering of the conductive material in the bottoms of the channels to act as an electric conductor. Preferably the electrically insulating material is a synthetic plastics material while the coating material is metal plated thereon. In most cases copper is a convenient plating although in some cases it may be desirable, especially where good connections for very low current values are required, to use gold or silver as the plating material.

While this form of electrical socket is of general applicability a very useful example is for the manufacture of mounting parts for integrated circuits and other electronic components. In recent years there has been developed the manufacture of small integrated circuits which in themselves comprise a large number of electronic components encapsulated and having a number of leads projecting therefrom. These circuits need to be mounted with their leads connected in a panel or board which may provide connections to a large number of other integrated circuits also carried by the same board. Should one of the integrated circuits become defective it is desirable to be able to replace it quickly and conveniently in position in the board and accordingly it has been proposed to use mounting sockets or pads connected in the board and into which the terminals of the integrated circuits can simply be inserted for mounting the circuit as required. It is desirable for these mounting pads or sockets to be produced cheaply, to give a good electrical connection, to be robust and generally to be reliable in use.

Conveniently channels can be provided connecting the pins with the socket recesses so that after coating of the body raised portions of the body separating the channels can readily be machined off to leave separate conductors formed by the coatings of the surfaces of the bottoms of the recesses and channels connecting the socket recesses with the connector pins. However, while channels are preferred it will be appreciated that by selective machining a suitable pattern can be removed from a flat coated surface so as to leave coatings on selected portions of the surface to provide the required conductors.

Preferably means may be provided for enclosing the recesses and holding leads or other connectors of an associated electrical component, such as an integrated circuit, tightly in engagement with the conductive coating at the bottoms of the recesses. Such means can comprise a clamping member of electrically insulating material adapted to fit about part of the body and comprising individual clamping elements engageable in the socket recesses. Suitably these clamping elements may be in the form of ramps with the socket recesses in the form of channels, such ramps being progressively engageable in the channels upon insertion of the clamping member about the body.

Preferably retaining means are provided for retaining the clamping member about the body. This retaining means may conveniently comprise a resilient clip portion on one of the clamping members and body engageable with the other of the clamping member body. In a particular embodiment the clip portion comprises a retaining clip integrally formed with the clamping member and resiliently engageable with an undercut recess in the base.

As compared with conventional sockets having deformable connector pins it is possible for difficulty to occur in supporting a socket in accordance with the invention having rigid connector pins in position on a mounting board while the connector pins are soldered to circuit connections on the mounting board. In order to overcome this difficulty it is preferred for securing means to be provided for securing the socket to the mounting board. The securing means may comprise a deformable peg insertable through a hole in the base to engage in a hole in the mounting board. This peg may be detachably secured to the clamping member and, in a particular embodiment, is moulded integrally with the clamping member by a readily breakable connection which can be broken at the time the socket is required to be fixed in location on a mounting board. Preferably the peg has resilient portions for engaging securely the mounting board and is so formed that it can be removed readily once the socket has been secured in position by connection of the connector pins to conductors on the mounting board.

The invention will further be described, merely by way of example, with reference to the accompanying drawings, in which.

Figure 1:
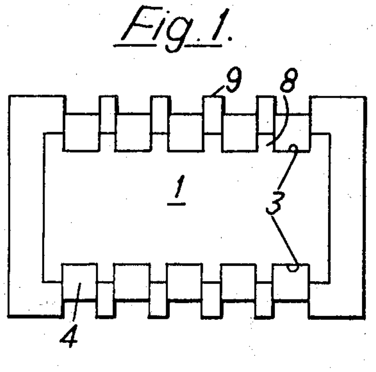
FIG. 1 is a top plan view of the body portion of a mounting socket for supporting an integral circuit and which embodies the invention.
Figure 2:
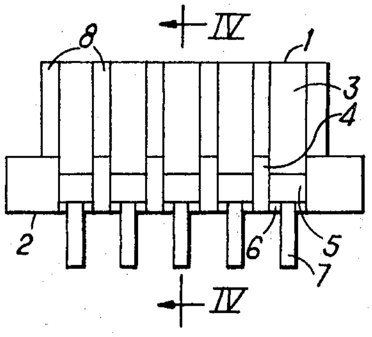
FIG. 2 is a side elevational view of the socket of FIG. 1.
Figure 3:
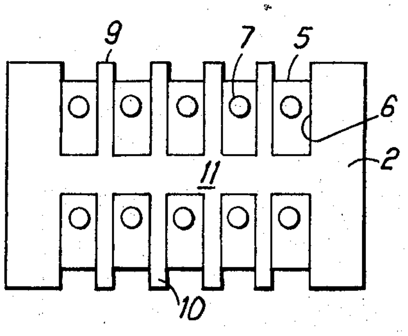
FIG. 3 is a bottom plan view of the socket of FIG. 1.
Figure 4:
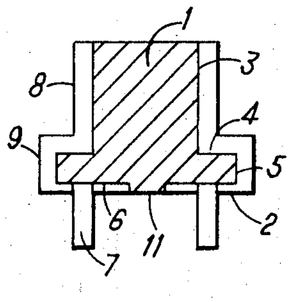
FIG. 4 is a sectional view taken along the line IV—IV of FIG. 2.
Figure 5:
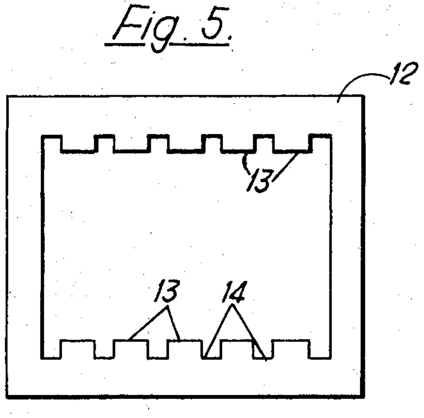
FIG. 5 is a plan view of a clamping member for use with the body portion of FIG. 1.

Referring to the drawings there is shown a mounting socket comprising two parts, a body portion shown in FIGS. 1, 2, 3 and 4 and a clamping member shown in FIG. 5. The body portion of FIG. 1 is a block of insulating material, typically a synthetic plastics material, having a top surface 1 and a bottom surface 2. Formed in the side of the upper part of the body are five channelled socket recesses 3 on each side of the body, the recesses 3 being separated by projecting ribs 8. A lower portion of the body has a larger dimension in plan view than the upper part and contains therein horizontal channels 4 connecting with the channels 3 at their inner end and separated from each other by ribs aligned with the ribs 8. Down the outside of the lower portion of the body are provided channels 5 separated by ribs 9 and continuing vertically down from the outer ends of the channels 4. Channel recesses 6 extend inwardly from the channels 5, being separated from each other by ribs 10 and 11, the rib 11 extending centrally of the bottom 2 of the body to separate the recesses 6 on opposite sides of the body. Connector pins 7 project downwardly from the recess 6.

During fabrication of the body after machining, or moulding, the body to the form shown, it is plated with, most usually, copper, although in some circumstances it may be preferred to use another metal as conductive coating, for example, gold or silver. This plating may be done in a conventional manner by initially etching the surface of the body, applying a preliminary layer of nickel, and then applying the final layer of copper to provide the necessary electrically conductive layer.

Subsequent to the plating operation the body is machined on its top and side surfaces so as to remove the peaks of the ridges between channels so that the metal plating at the bottoms of the channels is electrically insulated from each other.

On the bottom surface as well as machining to remove plating metal from the ribs 11 also the ribs 10 need to have the surface metal removed therefrom in order to prevent there being an electrically conductive path between adjacent recesses 6. The pins 7 remains coated with plating metal with the result that each is connected by plating metal left in the bottoms of the channels 6, 5 and 4 with the socket channel recesses (3).

While all the conductive paths retained in the body have been shown in the illustrated embodiment as being comprised within recesses below the surrounding surface of the body it will be appreciated that in some instances it may be simpler simply to remove the plating material selectively from a flat surface of the body to obtain the necessary result. Thus, in particular, instead of having recesses provided in the bottom surface of the body one may have a flat surface and remove the plating material from this flat surface generally along the areas indicated by the ribs 11 and 10 in the illustrated embodiment. In order to ensure a good coating the recesses 3 need to remain in the form of recesses and also, in order to simplify machining, it is desirable to utilise the channels 4 and 5 rather than removing plating material from areas of a flat body between these required plated areas.

FIG. 5 shows a clamping member for use with the body of FIG. 1. This clamping member 12 comprises a plurality of projecting ramps 13 which, when the element 12 is inserted over the upper portion of the body, fit within the channel recesses 3 with the projections 8 being received within the channels 14 between the ramps 13. During use of the socket a circuit element, for example an integrated circuit, can be placed over the upper surface 1 with its terminal leads received within selected socket recesses 3. The clamping member 12 can then be inserted in situation so that ramps 13 act as clamping elements to engage and to force the connectors of the integrated circuit against the bottom of the associated socket recess to ensure firm retention of the circuit element in position with a good electrical connection being given between the connector leads of the circuit element and the plating metal at the bottom of the individual channels. The body itself can be mounted on a board in conventional fashion with the pins 7 connected as required to the circuitry of the board.

FIGS. 6 to 10 illustrate an alternative embodiment of the invention generally similar to that of FIGS. 1 to 5 but with certain refinements.

Figure 6:
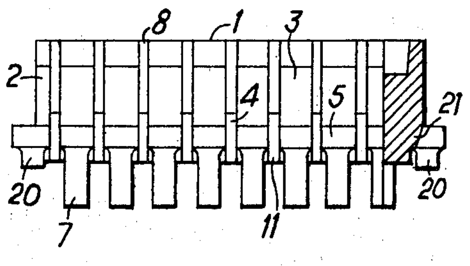
FIG. 6 is an elevational view showing in part section the base member of a further embodiment of socket in accordance with the invention.
Figure 7:
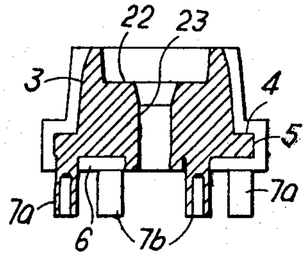
FIG. 7 is a transverse sectional view of the base member shown in FIG. 6.
Figure 8:
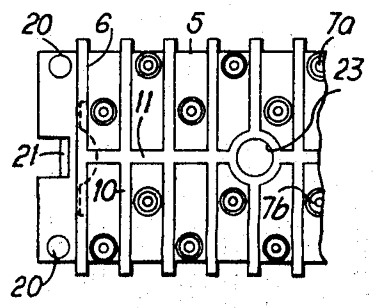
FIG. 8 is a fragmentary bottom plan view of the base member of FIG. 6.

Referring to FIG. 6 there can be seen mounting pads 20 projecting slightly below the bottom surface of the base 2. These mounting pads 20 are provided one at each corner of the base for engagement, in use of the socket, with a mounting board to hold the base of the socket slightly clear of the mounting board. A further difference apparent from FIG. 6 is the provision of an inclined undercut surface 21 which, as can be seen in FIG. 8, is provided within a recess. This recess is engageable by a retaining clip portion 25 of a clamping member 12 shown in FIG. 9 as will later be described. The embodiment of FIGS. 6 to 10 instead of having a symmetrical arrangement of pins 7 has rows of pins 7*a* and 7*b* which are in staggered relationship as can be seen from FIG. 8. A hole 23 extends from a recess 22 in the upper surface of the base 2 through to the under surface of the base for a purpose to be explained.

Figure 9:
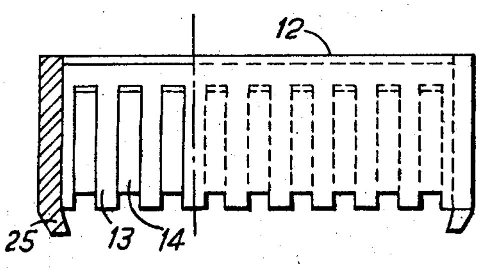
FIG. 9 is a side elevational view partly in section of a clamping member for use with the base member of FIG. 6.
Figure 10:
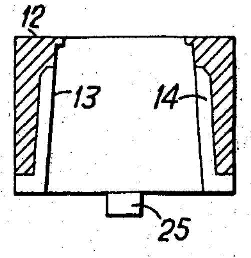
FIG. 10 is a transverse sectional view of the clamping member of FIG. 9.

The clamping member 12 shown in FIGS. 9 and 10 comprises inclined ramps 13 engagable with inclined channels 3 in the base member 2 and also comprises retaining clips 25 integrally formed therewith for engagement with the undercut surfaces 21 of the recesses in the base member. With this arrangement simply by pushing the clamping member down and about over the base member the resilient clip portions 25 engage the undercut surfaces 21 securely to retain the clamping member in position once an electrical component has been mounted thereto in use of the socket.

Figure 11:
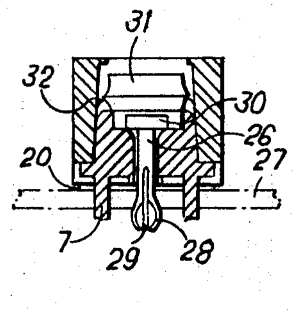
FIG. 11 is a transverse sectional view of a socket in accordance with the invention shown diagrammatically mounted for use.

FIG. 11 illustrates a modified form of a socket in use. This socket is generally similar to that of the embodiments of FIGS. 9 and 10 with the exception that instead of having a staggered row arrangement of the connector pins 7, two aligned rows are provided. The socket is shown mounted on a mounting board 27, illustrated in phantom, with the pins 7 projecting through the board. The socket is shown secured to the board by means of a peg 26 projecting through the hole 23 and through a hole in the mounting board. The peg 26 comprises a head 30 engageable with the base within the recess 22 and also comprises a resilient end portion engageable with the mounting board. The resilient end portion comprises a pair of lugs 28 mounted on opposite sides of a slot 29. The peg 26 is made of a resilient plastics material so that upon insertion through the hole 23 and the hole in the mounting board the lugs 28 are cammed inwardly until they spring apart once they have reached the location shown in FIG. 11. As shown the pads 20 bear against the mounting board to support the bottom of the base member 26 clear of the mounting board. An integrated circuit 31 is shown in situ in the socket with connector leads 32 from the integrated circuit being gripped between the clamping member and the base member.

The purpose of the peg 26 is to locate the base member 2 in situ on the mounting board while connections are made, for example by soldering, between conductors on the rear of the mounting board and the ends of the connector pins 7. Once the socket has been securely positioned by these connector pins normally the peg 26 will be removed rather than being left in situ as shown in FIG. 11. In order to provide complete assembly for sale the peg 26 can be moulded integrally with the clamping member 12 being connected thereto by a readily frangible integral connection of plastics. A suitable location for the moulding of the peg is within the space at the upper side of the clamping member 12 with the integral frangible connection being to one end wall of the clamping member. With this arrangement upon receipt by a user the peg can be broken from the clamping member and used to retain the base in situ on the mounting board. Once the connections have been made to the connector pins 7 of the base the peg can be removed leaving the base ready for receipt of electrical component such as an integrated circuit. The integrated circuit can then be located with the connector leads therefrom within the channels 3 of the base. Upon positioning of the clamping member 12 over the base the clamping elements wedge the connector leads against the conductive material at the bottom of the channels to provide a good electrical connection therebetween. Upon full engagement of the clamping member with the base the resilient clip portions 25 engage the undercut surfaces 21 securely to hold the clamping member in its engaging position. In order to give a good wedging action between the clamping elements 13 and the bottoms of the channels 3 the channel bottoms and the clamping elements are preferably slightly inclined together. In a particular arrangement the clamping elements 13 have a surface inclined at an angle of 4° with the vertical as shown in FIG. 10 and the channels 3 have a surface inclined at an angle of 5° with the vertical as shown in FIG. 7.

We claim:

1. A socket for mounting electrical components and comprising a body of electric insulating material having a plurality of socket recesses moulded therein and also having connecting pins moulded integrally with the body, said body being coated with electrically conductive material which has subsequently been selectively removed to leave conductive material upon the connector pins and in the recesses to provide electrical connections, the socket including conductors formed of said coating material individually electrically connecting the connector pins to respective socket recesses.

2. A socket according to claim 1, including channels in the body connecting the pins with the socket recesses and defined by raised portions of the body therebetween, said raised portions having had the conductive coating removed therefrom to leave separate ones of said conductors formed by the coatings of the surfaces of the bottoms of the channels connecting the socket recesses with the connecting pins.

3. A socket according to claim 1 which is adapted to receive an electrical component having leads or other connectors thereon, the socket being provided with means for enclosing the recesses and holding said leads in conductive engagement with the conductive coating at the bottoms of the recesses.

4. A socket according to claim 3, wherein the means for enclosing the recesses comprises a clamping member of electrically insulating material adapted to fit about part of the body and comprising individual clamping elements engageable in the socket recesses.

5. A socket according to claim 4 wherein the clamping elements are in the form of ramps with the socket recesses in the form of channels, such ramps being progressively engageable in the channels upon insertion of the clamping member about the body.

6. A socket according to claim 4, wherein retaining means are provided for retaining the clamping member about the body.

7. A socket according to claim 6, wherein the retaining means comprises a resilient clip portion on one of the clamping member and body engageable with the other of the body and clamping member respectively.

8. A socket according to claim 7, wherein the clip portion comprises a retaining clip integral with the clamping member, the body having an undercut recess resiliently engageable by said retaining clip.

9. A socket according to claim 1, adapted for mounting on a mounting board said socket including securing means for securing the socket to said mounting board.

10. A socket according to claim 9, wherein said mounting board and said body each have a hole therethrough, said securing means comprising a deformable peg insertable through said hole in the body to engage in said hole in the mounting board.

11. A socket according to claim 10, wherein said peg comprises a slot at one end with a pair of lugs extending from opposite sides of the slot whereby the lugs are deformable inwardly upon passing of the peg into the mounting board with the lugs being resiliently prised outwardly to engage the board.

12. A socket according to claim 10, wherein the peg is detachably secured to the clamping member.

13. A socket according to claim 12, wherein the peg is moulded integrally with the clamping member.

14. A socket in accordance with claim 2, wherein a plurality of connector pins are located in a staggered arrangement projecting from a single surface of the base.

* * * * *